(12) United States Patent
Yang et al.

(10) Patent No.: US 7,161,221 B2
(45) Date of Patent: Jan. 9, 2007

(54) LIGHT RECEIVING ELEMENT AND METHOD OF MANUFACTURING THE SAME

(75) Inventors: Seung-Kee Yang, Suwon-shi (KR); Ahn-Goo Choo, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 32 days.

(21) Appl. No.: 10/657,371

(22) Filed: Sep. 8, 2003

(65) Prior Publication Data

US 2004/0188787 A1    Sep. 30, 2004

(30) Foreign Application Priority Data

Mar. 28, 2003   (KR) .................. 10-2003-0019621

(51) Int. Cl.
*H01L 31/0232*  (2006.01)
(52) U.S. Cl. .............................. 257/432; 257/E31.127
(58) Field of Classification Search ............... 257/432, 257/E31.127
See application file for complete search history.

(56) References Cited

U.S. PATENT DOCUMENTS 5,218,223 A * 6/1993 Spaeth et al. ............... 257/436
6,246,097 B1 * 6/2001 Kato et al. ................... 257/432
2002/0084505 A1 * 7/2002 Furuya et al. .............. 257/466

FOREIGN PATENT DOCUMENTS

| JP | 04-336473 | 11/1992 |
| JP | 11-218638 | 8/1999 |
| JP | 2002-151668 | 5/2002 |

* cited by examiner

*Primary Examiner*—Jerome Jackson
(74) *Attorney, Agent, or Firm*—Cha & Reiter, L.L.C.

(57) ABSTRACT

A light receiving element for converting a received light signal into an electric signal and its manufacturing method are disclosed. The light receiving element includes a semiconductor substrate of a first conduction type; a semiconductor layer of a second conduction type; and a photo-absorption layer interposed between the semiconductor substrate and the semiconductor layer of the second conduction type. The semiconductor substrate comprises: a first groove having an inclination with respect to an incidence plane of the light signal so that the light signal can be refracted when the light signal has been incident to the first groove; and a second groove by which the light signal having been refracted by the first groove is reflected fully and then absorbed into the photo-absorption layer, so that a vertical-incidence drift of the light signal toward the photo-absorption layer is minimized.

13 Claims, 6 Drawing Sheets

LIGHT RECEIVING ELEMENT AND METHOD OF MANUFACTURING THE SAME

CLAIM OF PRIORITY

This application claims priority to an application entitled "Light receiving element and method of manufacturing the same," filed in the Korean Intellectual Property Office on Mar. 28, 2003 and assigned Serial No. 2003-19621, the contents of which are hereby incorporated by reference.

BACKGROUND OF THE INVENTION

1. Field of the Invention

The present invention relates to a light receiving element for converting a received light signal into an electric signal and a method of manufacturing the same.

2. Description of the Related Art

An optical coupling allows light signals emitted from light sources, such as a laser diode, fiber, a Planar Lightwave Circuit (PLC) device and the like, to arrive at the light receiving surface without a loss, so as to be converted into optimal electric signals. Many studies have shown that a vertical photodiode has a higher reliability than a waveguide photodiode for the provision of light signal conversion.

In order to manufacture a light module of ultra-low cost, the light module must be manufactured in complete automatization, that is, in a chip mounting method. Therefore, two-dimensional optical coupling is necessary throughout the field of optical coupling, such as optical coupling between a laser diode and a photodiode, between a fiber and a photodiode, between a PLC and a photodiode, and so forth.

FIG. 1 is a sectional view showing the structure of a photo detector for two-dimensional optical coupling according to the prior art. The photo detector is a light receiving element having the so-called edge-illuminated refracting-facet structure.

As shown, the photo detector includes: an InP substrate 1, a light-incidence plane 2, an n-type InP layer 3, a photo-absorption layer 4, a p-type InP layer 5, a p-type electrode 6, and an n-type electrode 7. The light-incidence plane 2 of the photo detector is formed so as to be inclined at an angle of θ through a wet etching process. As a result, the photo detector has a structure in which incident light is refracted to the photo-absorption layer 4. The refracted light, which is incident to the photo-absorption layer, has longer effective absorption length than that of the light being incident in a vertical direction, thus increasing the receiving sensitivity.

However, the conventional photo detector undergoes a chemical etching process for forming an angled facet. As such, the manufacturing of the photo detector according to the conventional art has drawbacks in that reproducibility and uniformity of elements are difficult to achieve. Furthermore, if an anti-reflective coating layer is implemented to improve the performance, a difficult task of mesa etching is required which in turn reduces the productive yield as it requires additional steps.

SUMMARY OF THE INVENTION

Accordingly, the present invention has been made to overcome the above-mentioned problems and provides additional advantages, by providing a light receiving element having a vertical structure to enable two-dimensional coupling of a light signal generated from a light source.

One aspect of the present invention is to provide a light receiving element that may be realized in a reliable and simple implementation.

In one embodiment, a light receiving element for receiving a light signal and converting the received light signal into an electric signal is provided and includes: a semiconductor substrate of a first conduction type; a semiconductor layer of a second conduction type; and, a photo-absorption layer interposed between the semiconductor substrate and the semiconductor layer of the second conduction type. The semiconductor substrate further includes: a first groove having an inclination with respect to an incidence plane of the light signal so that the light signal can be refracted when the light signal has been incident to the first groove; and a second groove by which the light signal having been refracted by the first groove is totally reflected and then absorbed into the photo-absorption layer, so that a vertical-incidence drift of the light signal toward the photo-absorption layer is minimized.

It is preferred that the semiconductor substrate is made from a semiconductor material in which a specific crystalline direction is etched more slowly than other directions when it is wet-etched, so that the semiconductor substrate can achieve an inclined profile after being etched. The semiconductor substrate may be made from one of a group VI, a group II–VI, and a group III–V semiconductor substrate.

It is also preferred that the first groove and the second groove are formed so as to have a slant angle of 50° to 60° on the basis of a horizontal direction of the semiconductor substrate, and are formed so as to have a 'U' shape or a 'V' shape.

It is also preferred that the total reflection layer is made from one of an air layer, a vapor layer, and a metal layer having a thickness larger than the skin depth of the metal.

In another embodiment, a method of manufacturing a light receiving element is provided by performing the following steps: growing a first semiconductor layer, a photo-absorption layer, and a second semiconductor layer on a semiconductor substrate of a first conduction type, each of the first semiconductor layer and the second semiconductor layer having the same conduction type as that of the first semiconductor layer; selectively converting the second semiconductor layer from the first conduction type to a second conduction type by diffusing impurities; and, forming a first groove and a second groove by wet-etching the semiconductor substrate. The method further comprises a step of forming an anti-reflective coating layer on the first groove and a step of forming a total reflection layer made of metal on the second groove.

BRIEF DESCRIPTION OF THE DRAWINGS

The above features and advantages of the present invention will be more apparent from the following detailed description taken in conjunction with the accompanying drawings, in which.

DETAILED DESCRIPTION OF THE PREFERRED EMBODIMENT

Figure 1:
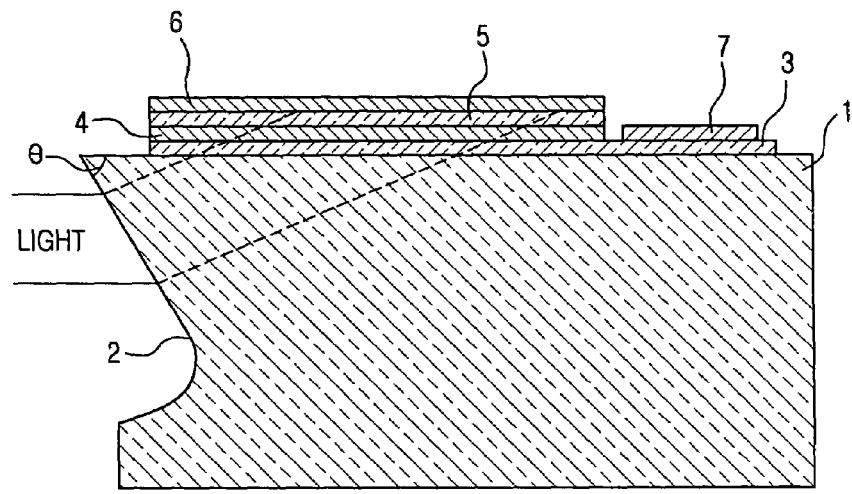
FIG. 1 is a sectional view showing the structure of a photo detector having an edge-illuminated refracting-facet according to the prior art.

Hereinafter, a light receiving element and a method of manufacturing the same according to preferred embodiments of the present invention will be described with reference to the accompanying drawings. It is to be noted that the same elements are indicated with the same reference numerals throughout the drawings. For the purposes of simplicity and clarity, a detailed description of well known functions and configurations incorporated herein will be omitted as it may make the subject matter of the present invention unclear.

Figure 2:
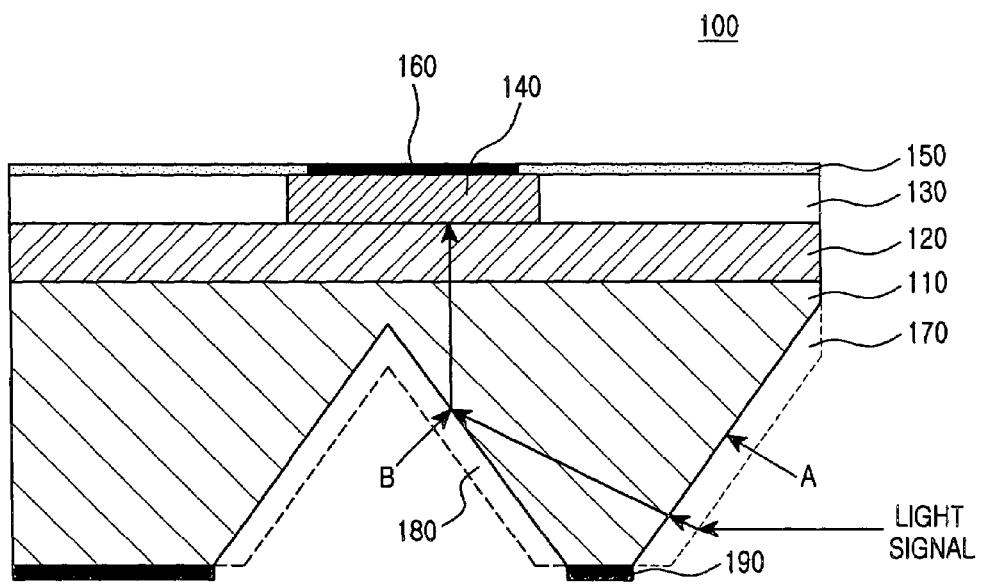
FIG. 2 is a sectional view showing the structure of a light receiving element according to a preferred embodiment of the present invention.

Referring to FIG. 2, a light receiving element 100 according to a preferred embodiment of the present invention includes an n-type InP substrate (first semiconductor layer) 110, an InGaAs photo-absorption layer 120 formed on the substrate 110, an InP window layer 130 formed on the photo-absorption layer 120, p-type InP active region (second semiconductor layer) 140 formed in appointed region of the window layer 130, a passivation layer 150 formed on the window layer 130, a p-type electrode 160 formed on the active region, an $SiN_x$ anti-reflective coating layer 170 formed on the bottom of the substrate 110, a total reflection layer 180, and a n-type electrode 190 formed on the bottom of the substrate 110.

The semiconductor substrate 110 consists of a semiconductor material that (Miller-Index: 111) is etched slowly so that an inclined profile can be formed after the etching process. The etching process is performed with a wet solution in which a specific crystalline direction is etched more slowly than other directions in accordance with crystallography process. The semiconductor substrate 110 is made of one of a group VI, a group II–VI, and a group III–V semiconductor substrates and produced in a single crystal growth using a chemical vapor deposition process.

The photo-absorption layer 120 is made of materials having a smaller bandgap energy than that of a wavelength of light signals intended for absorption thereon. To this end, InGaAs may be used to make the photo-absorption layer 120. In contrast, the window layer 130 is made of materials having greater bandgap energy than that of a wavelength of light signals which is intended for absorption, and InP may be used to make the window layer 130. Note that window layer 130 does not absorb light but passes the light passing therethrough. Therefore, the window layer 130 is conprised of larger bandgap energy.

The active region 140 performs the function of converting light signals absorbed through the photo-absorption layer 120 into electric signals, and is formed by selectively diffusing impurities having a conduction type which is opposite to the conduction type of the impurities in the substrate 110. The active region 140 is formed by diffusing impurities only in a specific region through a photolithograph process.

The passivation layer 150 prevents oxidation of the boundary surface of the window layer 130 positioned under the passivation layer 150 and may be made using dielectric materials, such as a silicon nitride.

The p-type electrode 160 and the n-type electrode 190 detects electric signals, which are photoelectric-converted in the active region 140, using an external circuit, and maybe made of metal materials.

The anti-reflective coating layer 170 enables light signals, which are inputted from light sources such as a laser diode, fiber, a PLC (Planar Lightwave Circuit) device and the like, to go through the inside of the substrate 110 without reflection. The anti-reflective coating layer 170 may be formed by depositing anti-reflective materials on a first groove surface A, which is formed with an inclination through an etching process. In an alternate embodiment, the anti-reflective coating layer 170 may be omitted, and in this case, about 30 to 35% of incident light signals are reflected off. Three factors determine whether the anti-reflective coating layer 170 is added; the desired reflection (that is, the degree of light loss), the convenience of the manufacturing process, and the characteristic of a light element. For example, in the case of an MPD (Monitor Photo Diode) performing a monitoring function of light signals, it is preferred not to form an anti-reflective coating layer 170 for the convenience of a manufacturing process.

The total reflection layer 180 reflects all light signals inputted into the inside of the substrate 110 through the anti-reflective coating layer 170. The total reflection layer 180 may consist of an air layer or a vapor layer, without other material layers, on second groove surface B, which is formed with an inclination on a rear surface of the substrate 110 by an etching process. Note that air layer does not perform any process. Further, the total reflection layer 180 may be formed by depositing total-reflection materials on the second groove surface B through a CVD (Chemical Vapor Deposition) process or a PVD (Physical Vapor Deposition) process. For example, the total-reflection materials can use all materials having reflective index less than 2.7.

Now, the operation of the light receiving element having the construction as described above is as follows.

Figure 3:
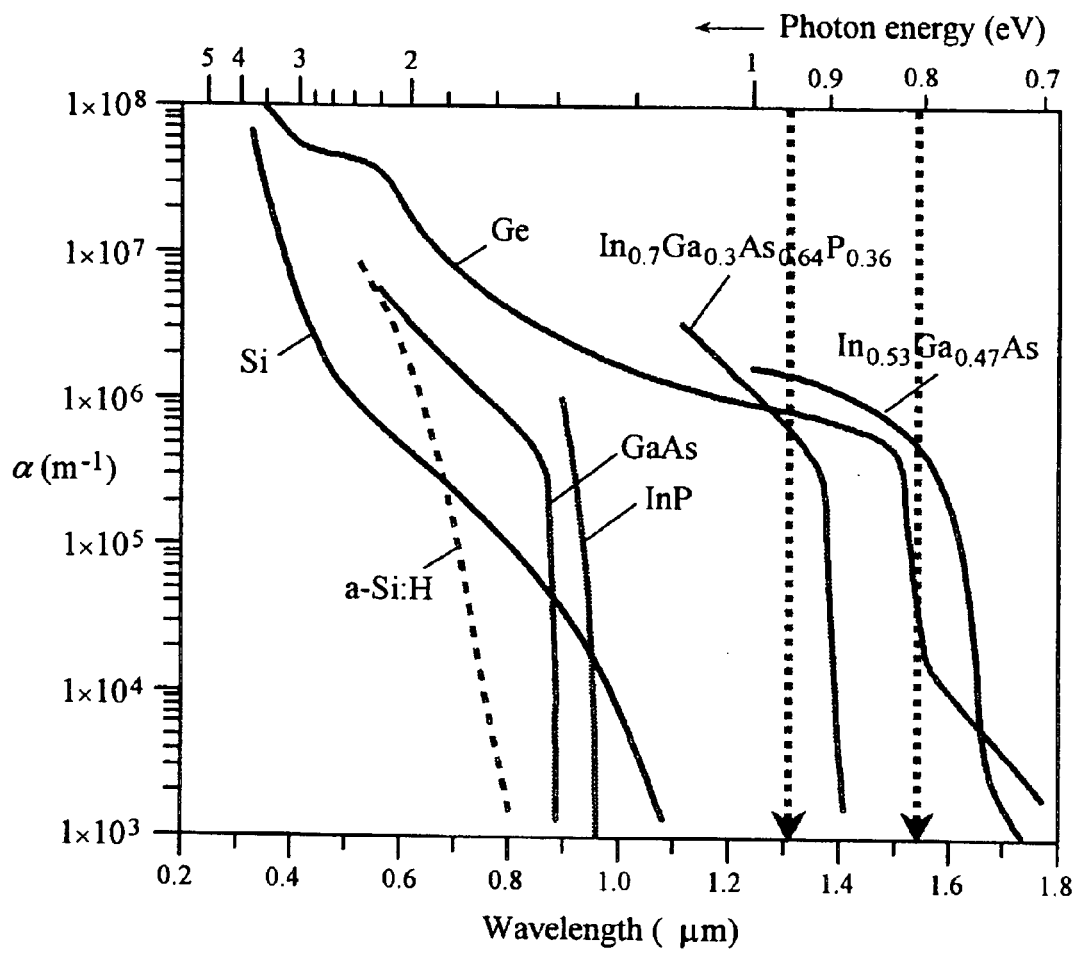
FIG. 3 is a view for explaining the characteristics of absorption coefficients according to the wavelengths in various semiconductors.

Referring again to FIG. 2, light signals, which are inputted from light sources, such as a laser diode, fiber, a Planar Lightwave Circuit (PLC) device and the like, arrive at the first groove surface A, then progress into the inside of the n-type InP substrate 110 via the anti-reflective coating layer 170, which is formed on the first groove surface A. At this point, light signals passes through without being absorbed in the n-type InP substrate 110. Note that the light signals have wavelengths of 1.3 μm (energy bandgap of 1 eV) and 1.55 μm (energy bandgap of 0.8 eV), which are common light signals used in most optical communication systems. As shown in FIG. 3, the reason for this is that the energy bandgap of the InP is too large in normal temperature to absorb any energy, thus the light signals pass through the n-type InP substrate 110. Therefore, incident light progresses through the first groove A at a refracted state without any light loss. Note that incident light is refracted whenever it passes two different media from each other, which is illustrated in Snell's law in which the degree of the refraction of light is defined when light passes a boundary surface between two media having different properties.

Figure 4:
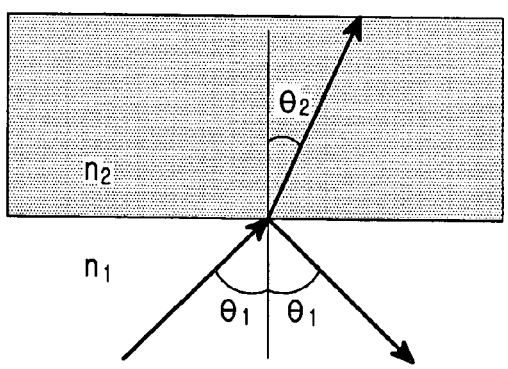
FIG. 4 is a view for explaining Snell's law.

Referring to FIG. 4, Snell's law is defined as:

$$n_1 \sin \theta_1 = n_2 \sin \theta_2$$

Herein, $n_1$ represents a refractive index of an incidence layer through which light is incident to an interface, $\theta_1$ represents an incidence angle of the light with respect to the vertical line to the interface, $n_2$ represents a refractive index of a refraction layer through which the light proceeds after passing the interface, and $\theta_2$ represents a refraction angle of the light with respect to the vertical line to the interface.

In view of Snell's law, the incident light is refracted when the light is incident from air (refractive index=1) to the anti-reflective coating layer 170 (refractive index of $SiN_x$=2.0), and is also refracted when the light is incident from the anti-reflective coating layer 170 to the substrate 110 (refractive index of InP=3.47). As such, if the anti-reflective coating layer 170 is formed as multiple layers, the incident light will be refracted as many times as there are layers.

The incident light ($\theta_2$=25.7) progressing inside the substrate 110 is refracted totally at the second groove surface B having a total-refraction layer, and thus is incident to the photo-absorption layer 120 without loss of light signals. The principle of the total refraction of the second groove surface B is as follows.

Figure 5:
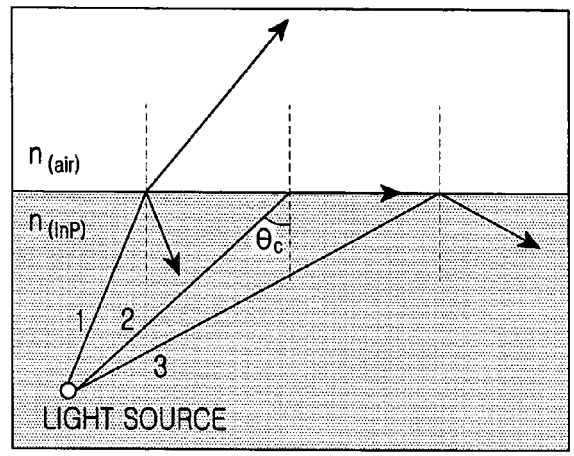
FIG. 5 is a view for explaining the principle of total reflection.

Referring to FIG. 5, in a case where light is incident from a first medium (refractive index of the InP substrate=3.47) having a refractive index to a second medium (refractive index of air=1) having a smaller refractive index than that of the first medium, a refraction angle of the light, like the first light shown in FIG. 5, become larger than the incidence angle of the light according to Snell's law. By increasing the incidence angle continuously, when the incidence angle become a critical angle ($\theta_c$), like the second light shown in FIG. 5, the refraction angle become 90°. Further, when the incidence angle become larger than the critical angle ($\theta_c$), like the third light shown in FIG. 5, all the light is not refracted, but reflected instead.

In the above scenario, Snell's law is applied as follows.

$n_1 \sin \theta_c = n_2 \sin 90°$ $\sin \theta_c = n_2/n_1$

Accordingly, since $\sin \theta_c = n_{(air)}/n_{(InP)}$, the critical angle ($\theta_c$) is 16.7° and $\theta_4$ is 29°. Therefore, the light incidented on the second groove surface B is incident at an angle of 61° (90°−29°=61°) on the basis of a vertical line of the boundary surface in which the angle of 61° is larger value than the critical angle of 16.7°. As a result, the impinged light is not refracted but totally reflected at the second groove surface B. In practice, the vertical-incidence angle of light, which is reflected on the second groove B and then progresses to the photo-absorption layer 120, deviates very slightly from the central axis to 97° to 94°.

Figure 6:
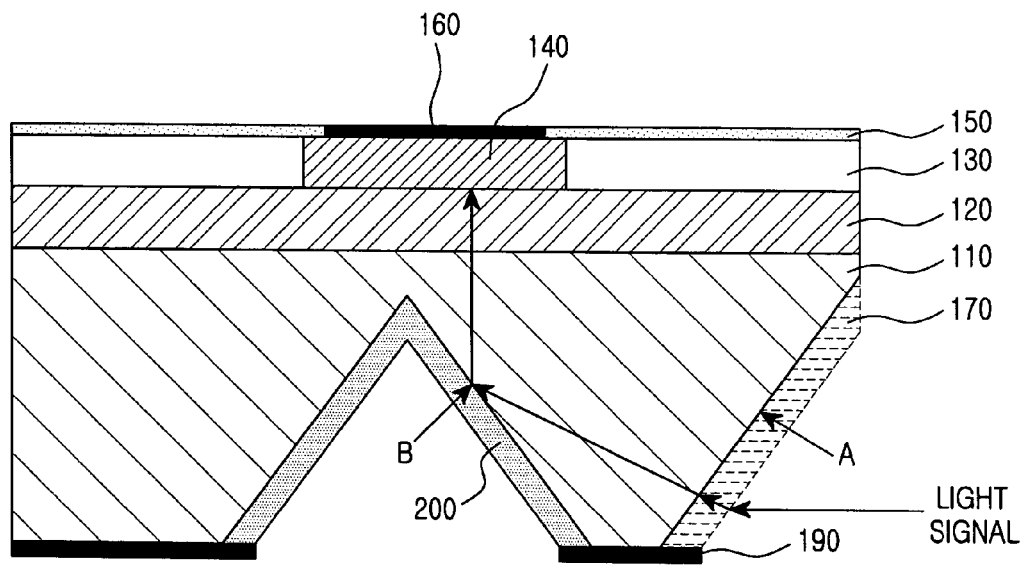
FIG. 6 is a sectional view showing the structure of a light receiving element according to another embodiment of the present invention; and, FIGS. 7a to 7e are sectional views for showing the manufacturing process of a light receiving element according to a preferred embodiment of the present invention.

FIG. 6 is a sectional view showing the structure of a light receiving element according to another embodiment of the present invention. As shown, the construction and operation of the this embodiment are essentially the same as those described above with respect to FIG. 2. The only notable difference is that a metal layer is provided as the total reflection layer. Hence, the discussion of similar components described in the preceding paragraphs is omitted to avoid redundancy, as they are described with respect to FIG. 2.

The metal layer 200 is formed on the second groove surface B, so that light signals are reflected totally on the metal layer 200. As the metal layer has a skin depth of about 30 Å to 60 Å depending on the kind of metal and the wavelengths, the metal layer 200 is formed so as to have a thickness larger than the skin depth.

FIGS. 7a to 7e are sectional views showing the manufacturing process of a light receiving element according to a preferred embodiment of the present invention.

Figure 7A:
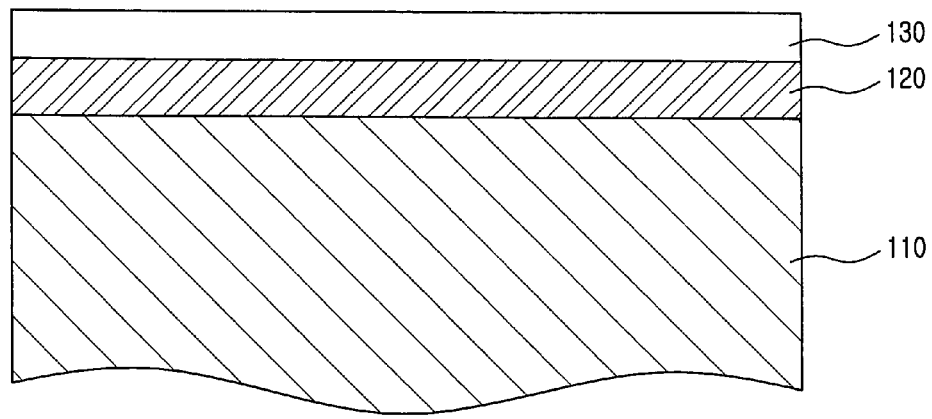

First, as shown in FIG. 7a, an InP buffer layer (not shown), a photo-absorption layer 120, and a window layer 130 are formed in sequence, through a single crystal growth of the n-type InP substrate 110 using a Metal-Organic Chemical Vapor Deposition (MOCVD) process. The photo-absorption layer 120 is made of materials having smaller energy bandgap than that of the wavelengths of light signals to be absorbed. In particular, InGaAs may be used to make the photo-absorption layer 120. The window layer 130 is made of materials having larger energy bandgap than that of the wavelengths of light signals to be absorbed. To this end, InP may be used to make the window layer 130.

Figure 7B:
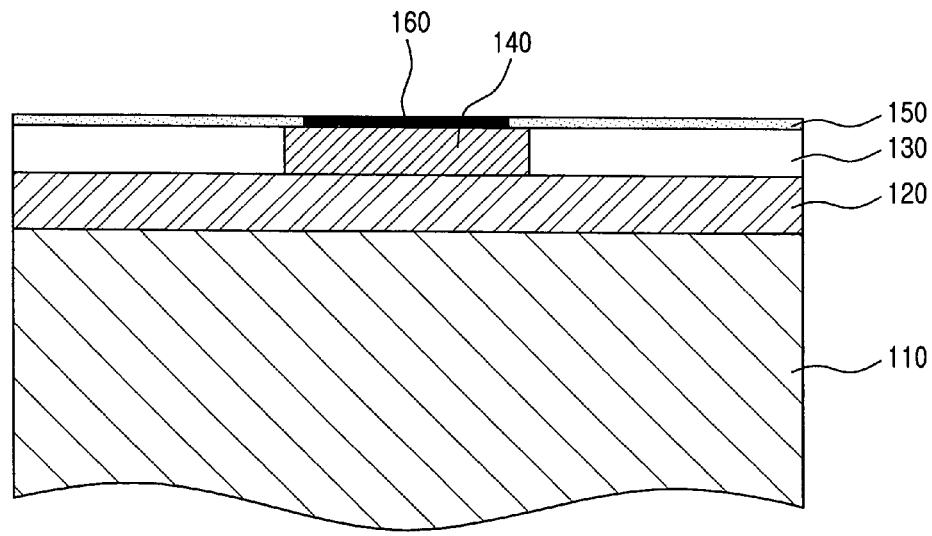

As shown in FIG. 7b, a p-type InP active region 140 is formed by diffusing p-type impurities selectively in a predetermined region of the window layer 130, and a passivation layer 150 is formed from dielectric materials so as to prevent oxidation of the interface of the window layer 130. Finally, a p-type electrode 160 is formed on the active region 140.

Figure 7C:
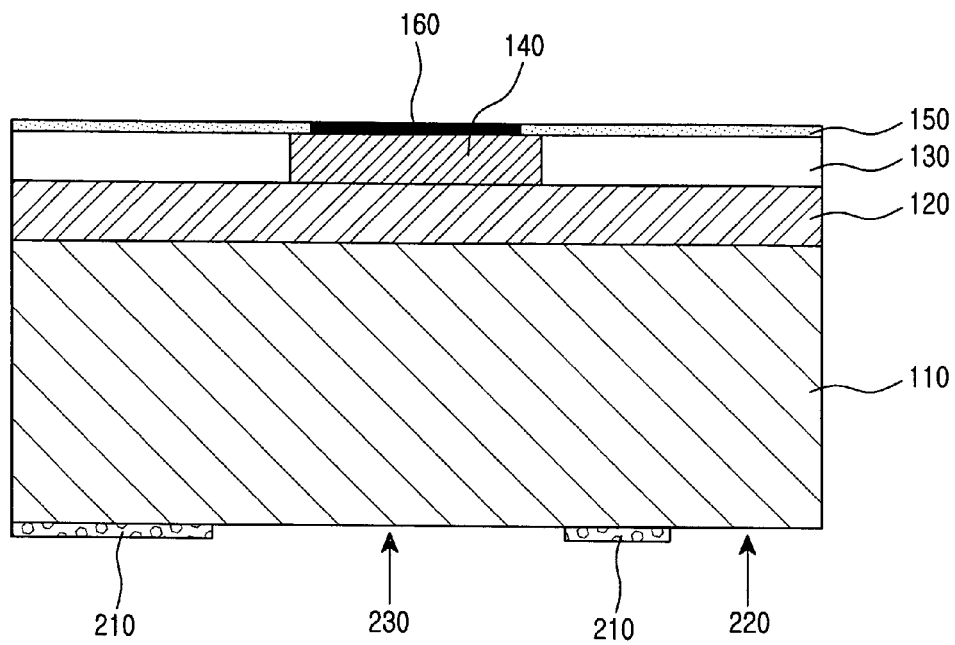

Next, as shown in FIG. 7c, a thinning process of grinding the InP substrate 110 to a desired thickness is performed, and etching masks 210 are selectively formed on one end of the InP substrate 110. A first groove area 220 and a second groove area 230 are determined by the etching masks 210, then the etching masks 210 are formed so that the first groove area 220 forms a portion of an edge of one side of the InP substrate 110. The etching masks 210 may be made of dielectric films such as $SiN_x$, $SiO_2$ or PR (Photo Resist).

Figure 7D:
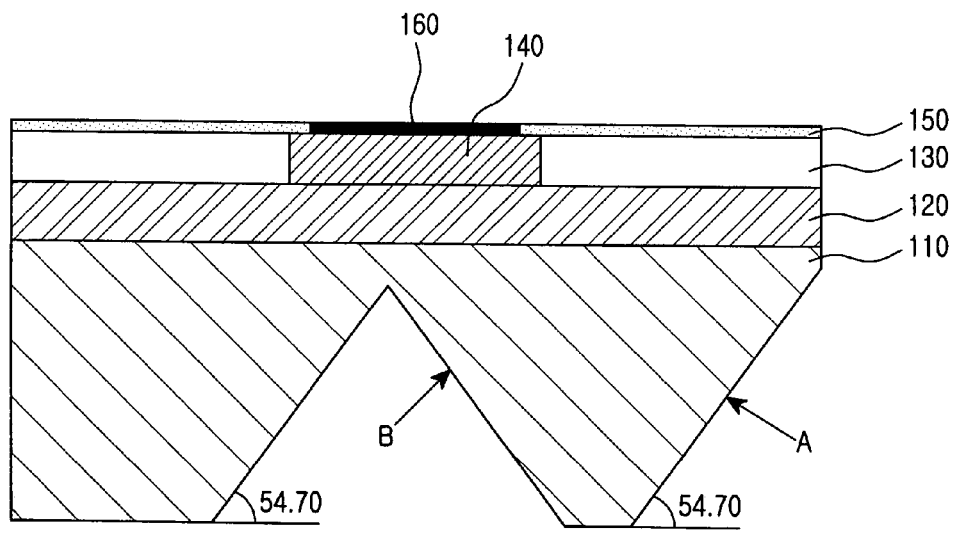

Thereafter, the InP substrate 110 is etched using a wet etching process. An etching solution may be changed depending on the type of substrate. The wet etching makes use of the characteristic that (111) plane is etched more slowly than other directions than (111) plane in the crystal structure. Therefore, the wet etching is performed until the (111) plane appears. For example, if an InP substrate 110 is used, an HCl-based, an HBr-based or a Br—Me(OH)-based etching solution is used to form the (111) plane. Alternatively, (111) plane may be obtained by using a KOH-based etching solution if an Si substrate, or using a $H_2SO_4$-based etching solution of a GaAs substrate. Slant angles of (111) planes formed by such a process are different according to the type of substrate's materials and etching solution employed, but most of the (111) planes have a slant angle of 54.7±55° on the basis of a horizontal direction. After a first groove A and a second groove B are formed through the wet etching process as shown in FIG. 7d, the etching masks 210 are removed (see FIG. 7D).

Figure 7E:
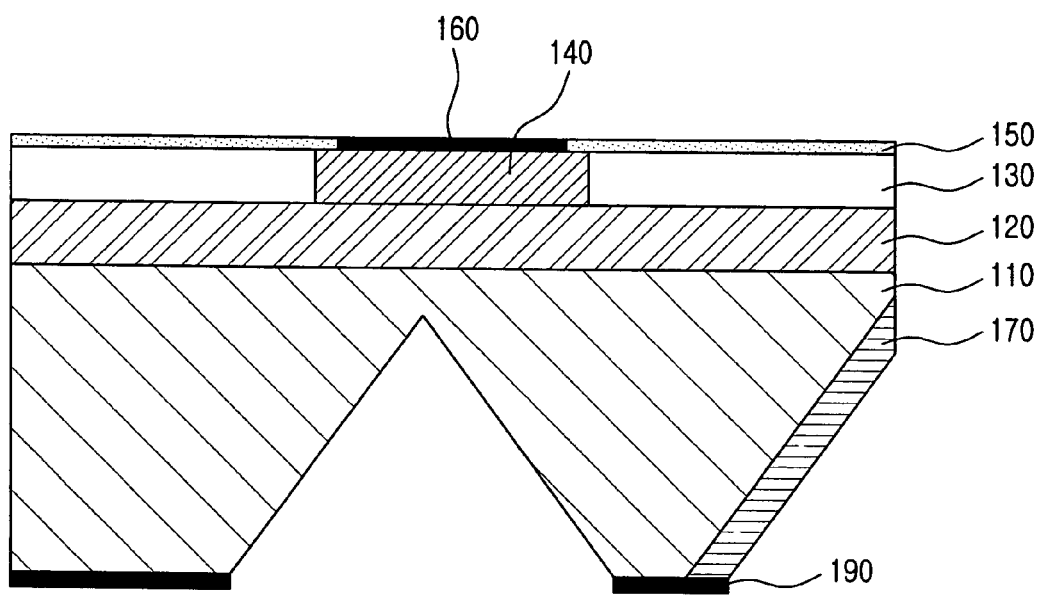

Finally, as shown in FIG. 7e, an anti-reflective coating (ARC) layer 170 is formed on the first groove A using a Plasma Enhanced Chemical Vapor Deposition (PECVD) or a Sputter technique, forms N-metal 190 through sputtering or e-beam evaporation after opening N-type electrode region through photolithography process, and then a n-type electrode 190. Then, the anti-reflective coating layer 170 is deposited to a thickness and has a composition capable of achieving an anti-reflective condition so that incident light is neither reflected nor lost.

As described above, in a case where the slant angle of the V-groove is 55°, the light receiving element according to the present invention can improve a vertical-incidence angle of light signals toward the photo-absorption layer by 97° to 94° through refraction and reflection in the substrate. Therefore, loss of light can be minimized, and it has an effect in which process the margin is greatly improved since a vertical-incidence drift representing the deviation degree of light signals according to the thickness of substrates is very small. In addition, in accordance with the present invention, a light receiving element having a vertical structure, which cannot be constructed into a two-dimensional package in the prior art, can be constructed into a two-dimensional package.

Therefore, in the work for optical coupling, the degree of freedom is reduced from three to two, and thus the working error is reduced.

Furthermore, with the manufacturing method of the light receiving element according to the present invention, an anti-reflective coating layer can be formed on a groove surface by using a simple PECVD process, so that it has an effect of increasing its process yield.

While the invention has been shown and described with reference to certain preferred embodiments thereof, it will be understood by those skilled in the art that various changes in form and details may be made therein without departing from the spirit and scope of the invention as defined by the appended claims. For example, the technical idea, in which the path of light signals is changed by refracting and reflecting light signals in using a first and a second groove formed on a substrate, may be variously applied to receiving elements manufactured in using a group VI, a group II–VI or a group III–V substrate. Therefore, this invention is not to be unduly limited to the embodiment set forth herein, but to be defined by the appended claims and equivalents thereof.

What is claimed is:

1. A light receiving element for converting a light signal into an electric signal, comprising:
   a semiconductor substrate;
   a semiconductor layer;
   a photo-absorption layer interposed between the semiconductor substrate and the semiconductor layer;
   an active region having a window layer disposed at both ends and disposed on top of the photo-absorption layer, the semiconductor substrate comprises:
   a first groove having an inclination with respect to an incidence plane of the light signal so that the light signal can be refracted when the light signal has been incident on the first groove;
   a second groove for reflecting the light signal refracted by the first groove to be absorbed into the photo-absorption layer, so that a vertical-incidence drift of the light signal toward the photo-absorption layer is minimized;
   a first electrode formed at a first bottom of the semiconductor substrate; and
   a second electrode formed at a second bottom of the semiconductor substrate,
   wherein the light signal enters the semiconductor substrate at a substantially horizontal orientation, refracts upon entering the first groove at a predetermined angle and propagating towards the photo-absorption layer, and further refracted after being reflected by the second groove so that the light signal is propagating substantially perpendicular to the base of the semiconductor substrate.

2. The light receiving element of claim 1, wherein the semiconductor substrate is made from a semiconductor material in which a specific crystalline direction is etched slowly, so that the semiconductor substrate has an inclined profile after being wet-etched.

3. The light receiving element of claim 2, wherein the semiconductor substrate exposes (111) plane after being etched by a wet solution.

4. The light receiving element of claim 3, wherein the semiconductor substrate is made from one of a group VI, a group II–VI, and a group III–V semiconductor substrate.

5. The light receiving element of claim 1, wherein the first groove and the second groove are formed to have a slant angle of 50° to 60° relative to a horizontal orientation.

6. The light receiving element of claim 1, wherein the first groove and the second groove have a 'U' shape or a 'V' shape.

7. The light receiving element of claim 1, wherein the first groove further comprises an anti-reflective coating layer so that the light signal is refracted without a reflection when the light signal is incident thereto.

8. The light receiving element of claim 7, wherein the anti-reflective coating layer is a deposited film formed by a chemical vapor deposition process or a physical vapor deposition process.

9. The light receiving element of claim 1, wherein the second groove further comprises a total reflection layer.

10. The light receiving element of claim 9, wherein the total reflection layer is made from a metal layer having a thickness substantially greater than the skin depth of the metal layer.

11. The light receiving element of claim 10, further comprising a dielectric film formed between the semiconductor substrate and the metal layer.

12. The light receiving element of claim 1, wherein the semiconductor substrate has a higher energy band gap than that of the light signal.

13. The light receiving element of claim 1, wherein the light receiving element further includes:
   a first electrode formed on the semiconductor layer.

* * * * *